(12) United States Patent
Kume et al.

(10) Patent No.: US 11,587,849 B2
(45) Date of Patent: Feb. 21, 2023

(54) SEMICONDUCTOR DEVICE AND MANUFACTURING METHOD THEREOF

(71) Applicant: Kioxia Corporation, Tokyo (JP)

(72) Inventors: Ippei Kume, Yokkaichi (JP); Kazuhiko Nakamura, Nagoya (JP); Shinya Okuda, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/116,037

(22) Filed: Dec. 9, 2020

(65) Prior Publication Data
US 2022/0084907 A1 Mar. 17, 2022

(30) Foreign Application Priority Data

Sep. 11, 2020 (JP) .............................. JP2020-153229

(51) Int. Cl.
*H01L 23/48* (2006.01)
*H01L 21/02* (2006.01)
(Continued)

(52) U.S. Cl.
CPC ........ *H01L 23/481* (2013.01); *H01L 21/0217* (2013.01); *H01L 21/02126* (2013.01); *H01L 21/02164* (2013.01); *H01L 21/3065* (2013.01); *H01L 21/76831* (2013.01); *H01L 21/76846* (2013.01); *H01L 21/76898* (2013.01); *H01L 23/5283* (2013.01)

(58) Field of Classification Search
CPC ............. H01L 23/481; H01L 23/49827; H01L 2225/06548; H01L 21/02126; H01L 21/02164; H01L 27/76831; H01L 27/76846; H01L 27/76898
See application file for complete search history.

(56) References Cited

U.S. PATENT DOCUMENTS 7,808,064 B2 10/2010 Kawasaki et al.
9,129,032 B2 9/2015 Cancel et al.
(Continued)

FOREIGN PATENT DOCUMENTS

| JP | 2009-158862 A | 7/2009 |
| JP | 2012-99548 A | 5/2012 |
| JP | 2018-157110 A | 10/2018 |

*Primary Examiner* — Jaehwan Oh
*Assistant Examiner* — John M Parker
(74) *Attorney, Agent, or Firm* — Oblon, McClelland, Maier & Neustadt, L.L.P.

(57) ABSTRACT

A device includes a substrate having a first-face and a second-face. An electrode is provided in a through hole that penetrates through the substrate between the first-face and the second-face. A first-insulator is provided in the substrate and protrudes in a radial direction from an opening end of the through hole on a side close to the second-face to a center of the through hole as viewed from above the first-face. A second-insulator protrudes in the radial direction from the first-insulator as viewed from above the first-face, is thinner than the first-insulator, and is in contact with the electrode. A third-insulator is provided between an inner wall of the through hole and the electrode, and includes a first-portion that is in contact with the first-insulator and a second-portion that is in contact with the inner wall of the through hole and is closer to the second-face than the first-portion.

10 Claims, 13 Drawing Sheets

(51) Int. Cl.
*H01L 21/768* (2006.01)
*H01L 23/528* (2006.01)
*H01L 21/3065* (2006.01)

(56) References Cited

U.S. PATENT DOCUMENTS

| | | | |
|---|---|---|---|
| 9,275,933 B2* | 3/2016 | Kuo | H01L 23/481 |
| 9,881,851 B2* | 1/2018 | Uchida | H01L 21/76898 |
| 10,153,227 B2 | 12/2018 | Kume et al. | |
| 10,297,531 B2 | 5/2019 | Noda et al. | |
| 10,468,334 B2 | 11/2019 | Kume et al. | |
| 2011/0304026 A1* | 12/2011 | Tsui | H01L 23/481 |
| | | | 257/E21.597 |
| 2012/0091520 A1* | 4/2012 | Nakamura | H01L 27/10894 |
| | | | 257/303 |
| 2012/0104563 A1* | 5/2012 | Saito | H01L 21/76898 |
| | | | 257/E21.531 |
| 2012/0199984 A1* | 8/2012 | Fujita | H01L 21/6835 |
| | | | 438/700 |
| 2013/0234341 A1 | 9/2013 | Onai | |
| 2017/0287996 A1* | 10/2017 | Kim | H01L 27/3265 |
| 2018/0269133 A1* | 9/2018 | Kume | H01L 21/76898 |
| 2019/0088545 A1 | 3/2019 | Okuda | |
| 2020/0006128 A1* | 1/2020 | Weng | H01L 23/5226 |
| 2022/0020667 A1* | 1/2022 | Park | H01L 21/76229 |

* cited by examiner

VLV

LV

HV

TSV

VLV

LV

HV

TSV

VLV

LV

HV

TSV

VLV

LV

HV

TSV

SEMICONDUCTOR DEVICE AND MANUFACTURING METHOD THEREOF

CROSS REFERENCE TO RELATED APPLICATIONS

This application is based upon and claims the benefit of priority from the prior Japanese Patent Application No. 2020-153229, filed on Sep. 11, 2020, the entire contents of which are incorporated herein by reference.

FIELD

The embodiments of the present invention relate to a semiconductor device and a manufacturing method thereof.

BACKGROUND

A semiconductor device has been developed which includes a plurality of semiconductor chips that are stacked and packaged. In this semiconductor device, a through electrode called a TSV (Through-Silicon Via) may be provided through the stacked semiconductor chips in order to electrically connect the semiconductor chips to each other.

Meanwhile, it is considered that the thickness of a substrate in each semiconductor chip is reduced in order to reduce the thickness of the semiconductor device. However, reduction of the thickness of the substrate in the semiconductor chip lowers an aspect ratio of the TSV. This eliminates the thickness difference of an insulating film, used as a mask when an opening of the TSV is formed, between on a top surface of the semiconductor chip and on a bottom surface of the TSV. In this case, it is difficult to selectively remove the insulating film on the bottom surface of the TSV, so that the opening at the bottom of the TSV becomes small. Size reduction of the opening of the TSV increases a resistance of connection by the TSV between the semiconductor chips.

DETAILED DESCRIPTION

Figure 1:
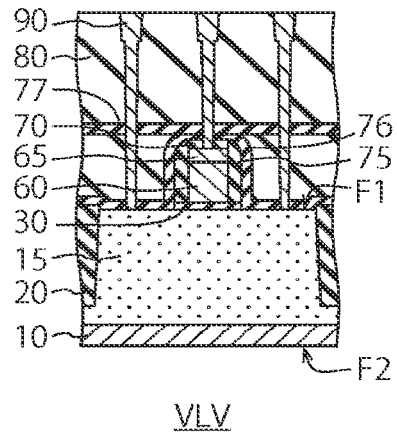
FIG. 1 is a cross-sectional view illustrating a configuration example of a semiconductor device according to the present embodiment.
Figure 1:
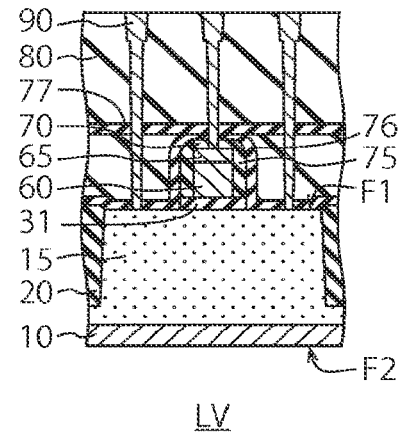
Figure 1:
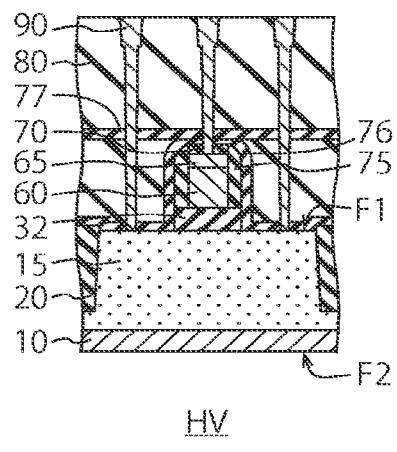
Figure 1:
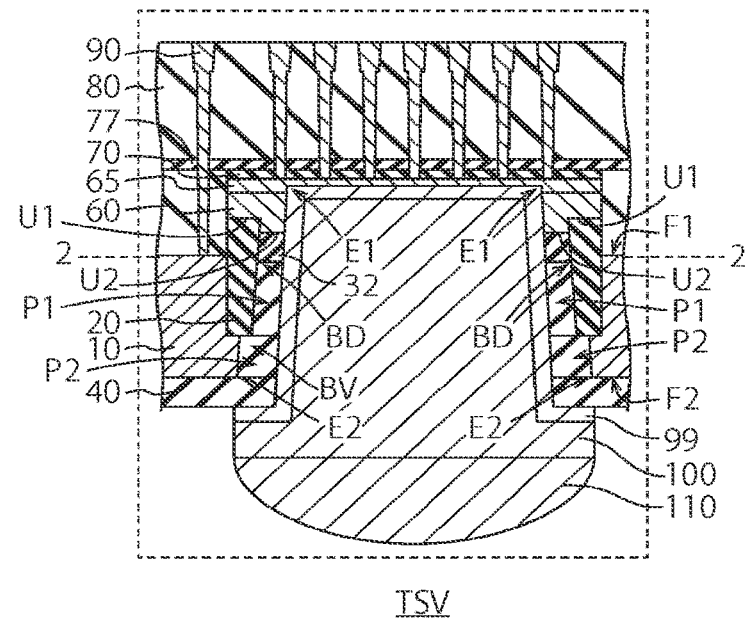
Figure 1:
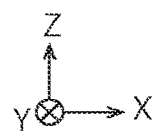

Embodiments will now be explained with reference to the accompanying drawings. The present invention is not limited to the embodiments. In the embodiments, "an upper direction" or "a lower direction" refers to a relative direction when a direction perpendicular to a surface of a semiconductor substrate on which semiconductor elements are provided is assumed as "an upper direction". Therefore, the term "upper direction" or "lower direction" occasionally differs from an upper direction or a lower direction based on a gravitational acceleration direction. In the present specification and the drawings, elements identical to those described in the foregoing drawings are denoted by like reference characters and detailed explanations thereof are omitted as appropriate.

A semiconductor device according to the present embodiment includes a semiconductor substrate having a first face provided with a semiconductor element and a second face opposite to the first face. A metal electrode is provided in a through hole that penetrates through the semiconductor substrate between the first face and the second face. A first insulating film is provided in the semiconductor substrate on a side close to the first face, and protrudes in a radial direction from an opening end of the through hole on a side close to the second face to a center of the through hole as viewed from above the first face. A second insulating film protrudes in the radial direction from the first insulating film as viewed from above the first face, is thinner than the first insulating film, and is in contact with the metal electrode. A third insulating film is provided between an inner wall of the through hole and the metal electrode, and includes a first portion that is in contact with the first insulating film and a second portion that is in contact with the inner wall of the through hole and is closer to the second face than the first portion.

FIG. 1 is a cross-sectional view illustrating a configuration example of a semiconductor device 1 according to the present embodiment. The semiconductor device 1 is not specifically limited and may be, for example, a logic circuit (CMOS (Complementary Metal Oxide Semiconductor) circuit) used for controlling a NAND flash memory or the like. The semiconductor device 1 may be electrically connected to a memory cell array (not illustrated) by being bonded to a semiconductor wafer on which the memory cell array is placed. Alternatively, the semiconductor device 1 may be electrically connected to the memory cell array via a through electrode TSV (Through-Silicon Via) illustrated in FIG. 1. The semiconductor device 1 may be provided below a memory cell array (not illustrated). That is, the semiconductor device 1 may be a semiconductor wafer or a semiconductor chip that is formed separately from a memory wafer or a memory chip, or may be a semiconductor wafer or a semiconductor chip that is integrally formed with a memory wafer or a memory chip.

This semiconductor device 1 includes, as a logic circuit, a very low voltage transistor VLV, a low voltage transistor LV, a high voltage transistor HV, and the like. In FIG. 1, the very low voltage transistor VLV, the low voltage transistor LV, the high voltage transistor HV, and the through electrode TSV are illustrated from left in that order. The semiconductor device 1 may further include more types of semiconductor elements such as transistors.

Configurations of the semiconductor device 1 are described below in more detail.

The semiconductor device 1 includes a semiconductor substrate 10, a well diffusion layer 15, an STI 20, a gate dielectric films 30 to 32, a spacer layer 40, a gate electrode 60, a metal film 65, a cap film 70, an interlayer dielectric film 80, a via plug 90, a stopper film 77, a barrier metal 99, a metal electrode 100, and a bump 110.

The semiconductor substrate 10 is, for example, a silicon substrate that is made thin. The semiconductor substrate 10 has a first face F1 and a second face F2 opposite to the first face F1. The very low voltage transistor VLV, the low voltage transistor LV, and the high voltage transistor HV are provided on the first face F1 of the semiconductor substrate 10. Further, the semiconductor substrate 10 has a through hole penetrating therethrough between the first face F1 and the second face F2. The metal electrode 100 is provided in the through hole.

In the present embodiment, it is assumed that a direction perpendicular to the first or second face F1 or F2 of the semiconductor substrate 10 is the Z-direction. One direction within a plane perpendicular to the Z-direction is assumed as the X-direction, and a direction that is within that perpendicular plane and is perpendicular to the X-direction is assumed as the Y-direction. FIG. 1 illustrates the semiconductor device 1, assuming that a direction in the Z-direction from the second face F2 to the first face F1 is an upward direction. However, the description of the through electrode TSV may be made assuming that a direction from the first face F1 to the second face F2 is an upward direction.

The STI (Shallow Trench Isolation) 20 as a first insulating film is provided in the first face F1 of the semiconductor substrate 10. The STI 20 defines an active area in which an element is formed in the first face F1, and electrically isolates adjacent active areas from each other. In each active area, a semiconductor element such as a memory cell array, a transistor, a resistor element, and a capacitor element, is formed. As the STI 20, a silicon oxide film deposited by CVD (Chemical Vapor Deposition) is used, for example.

The well diffusion layer 15 is provided in each active area. The gate dielectric films 30 to 32 are provided on the well diffusion layer 15 and serve as gate dielectric films of the very low voltage transistor VLV, the low voltage transistor LV, and the high voltage transistor HV, respectively. For example, thermal oxidation films formed by oxidizing the semiconductor substrate 10 are used as the gate dielectric films 30 to 32.

The gate dielectric film 30 is the thinnest, the gate dielectric film 31 is the second thinnest, and the gate dielectric film 32 is the thickest. Accordingly, a threshold voltage and a breakdown voltage of the very low voltage transistor VLV are the lowest. A threshold voltage and a breakdown voltage of the low voltage transistor LV are the second lowest. A threshold voltage and a breakdown voltage of the high voltage transistor HV are the highest. The very low voltage transistor VLV, the low voltage transistor LV, and the high voltage transistor HV may be identical to one another in a configuration other than the gate dielectric films 30 to 32. Accordingly, the very low voltage transistor VLV, the low voltage transistor LV, and the high voltage transistor HV can be simultaneously formed by using common manufacturing steps, except for the gate dielectric films 30 to 32.

The gate electrode 60 is provided on each of the gate dielectric films 30 to 32, and is electrically insulated from the well diffusion layer 15 in the semiconductor substrate 10 by the corresponding gate dielectric film 30, 31, or 32. A conductive material, for example, doped polysilicon is used for the gate electrode 60. The metal film 65 is provided on the gate electrode 60. Low-resistance metal compound, for example, tungsten silicide (WSi) is used for the metal film 65. The cap film 70 is provided on the metal film 65. An insulating material, for example, silicon nitride is used for the cap film 70.

A sidewall film 75 is provided on side surfaces of the gate electrode 60, the metal film 65, and the cap film 70. An insulating material, for example, silicon oxide is used for the sidewall film 75. Further, a liner layer 76 is provided to cover an outer portion of the sidewall film 75. An insulating material, for example, silicon nitride is used for the liner layer 76.

The interlayer dielectric film 80 is provided on the first face F1 of the semiconductor substrate 10 to cover the very low voltage transistor VLV, the low voltage transistor LV, and the high voltage transistor HV. A silicon oxide film formed by using TEOS (TetraEthOxySilane), for example, is used as the interlayer dielectric film 80. The stopper film 77 is provided on the cap film 70 in the interlayer dielectric film 80. An insulating film, for example, a silicon nitride film is used as the cap film 70.

The via plug 90 penetrates through the interlayer dielectric film 80 and the stopper film 77 and is electrically connected to the very low voltage transistor VLV, the low voltage transistor LV, or the high voltage transistor HV. Low-resistance metal, for example, tungsten is used for the via plug 90.

The very low voltage transistor VLV, the low voltage transistor LV, and the high voltage transistor HV are configured in this manner. Although the very low voltage transistor VLV, the low voltage transistor LV, and the high voltage transistor HV are different from one another in the thicknesses of the gate dielectric films 30 to 32, those transistors may be identical to one another in the other configurations. In practical use, the very low voltage transistor VLV, the low voltage transistor LV, and the high voltage transistor HV may be different from one another in the size (a gate width W/a gate length L), the impurity concentration in a channel region of the well diffusion layer 15, or a material for the gate electrode, for example.

In a case where a memory cell array includes a plurality of memory cells to which data can be written or from which data can be erased, the high voltage transistor HV may be a transistor used for applying a write voltage or an erase voltage of data to the memory cells.

Next, the configuration of the through electrode TSV is described in more detail.

Figure 2:
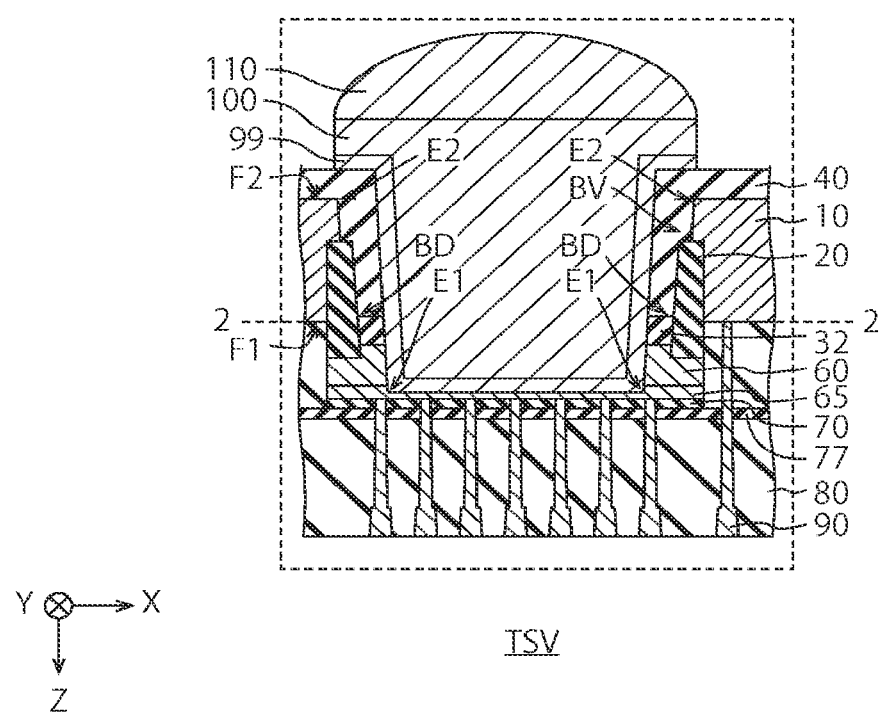
FIG. 2 is a cross-sectional view illustrating a configuration example of a through electrode.

FIG. 2 is a cross-sectional view illustrating a configuration example of the through electrode TSV. FIG. 2 illustrates a state where the through electrode TSV in FIG. 1 is turned upside down.

The through electrode TSV includes the semiconductor substrate 10, the STI 20, the gate dielectric film 32, the spacer layer 40, the barrier metal 99, the metal electrode 100, the bump 110, the gate electrode (an electrode pad) 60, the metal film 65, the cap film 70, the stopper film 77, the interlayer dielectric film 80, and the via plugs 90.

The semiconductor substrate 10 has a through hole BV provided between the first face F1 and the second face F2. The through hole BV is formed from the second face F2 toward the first face F1. The gate electrode 60 is arranged at the bottom of the through hole BV. In plan view as viewed from the second face F2 side, the through hole BV is provided within a range of the gate electrode 60, and the gate electrode 60 or the metal film 65 appears at the entire bottom of the through hole BV. The gate electrode 60 of the through electrode TSV does not serve as a gate electrode, but serves as an electrode pad that electrically connects the via plugs 90 and the metal electrode 100 to each other.

The spacer layer 40 is provided on the inner wall of the through hole BV and on a portion of the second face F2 of the semiconductor substrate 10. The spacer layer 40 is interposed between the semiconductor substrate 10 and the barrier metal 99 and electrically insulates them from each other. For example, a film formed by using TEOS (Tetra-EthOxySilane), silicon hydride oxide, silicon nitride, or silicon oxynitride or a film formed by using a multilayer film of two or more of them is used as the spacer layer 40.

The barrier metal 99 is provided on the inner wall of the through hole BV via the spacer layer 40. Further, the barrier metal 99 is in contact with the gate electrode 60 or the metal film 65 at the bottom of the through hole BV. A conductive material, for example, titanium or titanium nitride is used for the barrier metal 99.

Further, the metal electrode 100 is filled in the through hole BV. That is, the metal electrode 100 is provided in the through hole BV that penetrates through the semiconductor substrate 10 between the first face F1 and the second face F2. The metal electrode 100 is electrically connected to the gate electrode 60 via the barrier metal 99. Meanwhile, as illustrated in FIG. 1, the through hole BV may penetrate through the gate electrode 60 to reach the metal film 65 and, in this case, the metal electrode 100 is electrically connected to the metal film 65 via the barrier metal 99. Low-resistance metal such as copper, nickel, and aluminum, is used for the metal electrode 100. The bump 110 is provided below the metal electrode 100. Low-resistance metal, for example, solder or tin is used for the bump 110. The barrier metal 99 is negligibly thin as compared with the metal electrode 100, and can be regarded as one body together with the metal electrode 100. Therefore, the barrier metal 99 and the metal electrode 100 may be collectively called the metal electrode 100.

At the bottom of the through hole BV, the gate electrode 60 is provided on the metal electrode 100 and the barrier metal 99. The configuration of the metal film 65, the cap film 70, the stopper film 77, the interlayer dielectric film 80, and the via plug 90 provided on the gate electrode 60 may be the same as the configuration of those in the very low voltage transistor VLV, the low voltage transistor LV, and the high voltage transistor HV. However, in plan view as viewed in the Z-direction, a planar layout of the gate electrode 60, the metal film 65, and the cap film 70 in the through electrode TSV may be different from planar layouts of those in the very low voltage transistor VLV, the low voltage transistor LV, and the high voltage transistor HV. For example, the area of the gate electrode 60 and the like in the through electrode TSV may be larger than the area of the gate electrode 60 and the like in the very low voltage transistor VLV, the low voltage transistor LV, and the high voltage transistor HV. In this case, the via plugs 90 may be provided above the gate electrode 60, as illustrated in FIG. 1. With this arrangement, a wire (not illustrated) provided on the via plug 90 can be electrically connected to the gate electrode 60 with low resistance. Further, the gate electrode 60 and the metal film 65 do not serve as a gate electrode in the through electrode TSV, but serve as a wire or a plug that electrically connects the via plug 90 and the metal electrode 100 to each other. A lower surface of the gate electrode 60 may include a first electrode surface U1 facing the first face F1 and a second electrode surface U2 that is located on the through-hole center side of the first electrode surface U1 and is close to the first face F1 or the second face F2 as compared to the first electrode surface U1. The first electrode surface U1 and the STI 20 may be in contact with each other, and the second electrode surface U2 and the gate dielectric film 32 may be in contact with each other.

In the through electrode TSV, the sidewall film 75 and the liner layer 76 may be provided on side surfaces of the gate electrode 60, the metal film 65, and the cap film 70, although not illustrated. The configuration of the sidewall film 75 and the liner layer 76 in the through electrode TSV may also be the same as the configuration of those in the very low voltage transistor VLV, the low voltage transistor LV, and the high voltage transistor HV.

Further, the interlayer dielectric film 80 is provided on the first face F1 of the semiconductor substrate 10 to cover the structure on the first face F1 side of the through electrode TSV. The stopper film 77 is provided on the cap film 70 in the interlayer dielectric film 80.

The via plugs 90 penetrate through the interlayer dielectric film 80 and the stopper film 77 and are electrically connected to the gate electrode 60 in the through electrode TSV, as described above. The configuration of the interlayer dielectric film 80 and the via plugs 90 may also be the same as the configuration of those in the very low voltage transistor VLV, the low voltage transistor LV, and the high voltage transistor HV.

Here, the shapes of the STI 20, the gate dielectric film 32, the spacer layer 40, and the through hole BV in the through electrode TSV and the positional relation among them are described.

As illustrated in FIGS. 1 and 2, the STI 20 is provided from the first face F1 to a relatively deep position in the semiconductor substrate 10 for element isolation. The STI 20 of the through electrode TSV is provided along the outer edge of a formation region of the through hole BV to surround the through hole BV. Therefore, the outer edge of the through hole BV overlaps the STI 20 in plan view as viewed from above the first face F1. Therefore, in formation of the through hole BV, a portion of the through hole BV is formed in accordance with the outer edge of the STI 20 in a self-aligning manner. Thus, a portion of the inner wall of the through hole BV is configured by the STI 20 and the remaining portion thereof is configured by the semiconductor substrate 10. Accordingly, in plan view as viewed from above the first face F1, the STI 20 protrudes in a radial direction from the outer edge or the inner wall of the through hole BV toward the center of the through hole BV.

The STI 20 is not provided in a region surrounded by the STI 20 of the through electrode TSV. Instead, the gate dielectric film 32 is provided along the inner circumference of the STI 20. Therefore, in plan view as viewed from above the first face F1, the gate dielectric film 32 protrudes or extends in the radial direction from the inner circumference of the STI 20 toward the center of the through hole BV. The gate dielectric film 32 is thus provided along the inner circumference of the through hole BV and the inner circumference of the STI 20 inside them (see FIGS. 3 and 4).

Further, this STI 20 protrudes or extends in a direction from the second face F2 to the first face F1 more than the gate dielectric film 32 (see FIGS. 1 and 2).

The gate dielectric film 32 has the same thickness as the gate dielectric film 32 of the high voltage transistor HV, and is thicker than the gate dielectric films 30 and 31 of the very low voltage transistor VLV and the low voltage transistor LV. However, the gate dielectric film 32 is considerably thinner than the STI 20 used for element isolation. For example, the thickness of the gate dielectric film 30 is about 2 to 7 nm, and the thickness of the gate dielectric film 31 is about 5 to 15 nm. The thickness of the gate dielectric film 32 is about 20 to 60 nm, and the thickness of the STI 20 is about 300 nm or more.

Since the gate dielectric film 32 is thicker than the gate dielectric films 30 and 31 in this manner, the gate dielectric film 32 can serve as an etching stopper in formation of the through hole BV. Meanwhile, since the gate dielectric film 32 is thinner than the STI 20, it is no longer necessary to form the spacer layer 40 used as a mask in formation of the through hole BV to be so thick. This is because, in a case where the gate dielectric film 32 is thin, the gate dielectric film 32 at the bottom of the through hole BV can be sufficiently removed by being etched back even when the spacer layer 40 used as a mask is made thin. Making the spacer layer 40 thin can increase the opening diameter of the through hole BV on the first face F1 side. This increase results in increase of the area of contact between the metal electrode 100 or the barrier metal 99 and the gate electrode 60, thus reducing a contact resistance between the through electrode TSV and the gate electrode 60. A method of forming the through hole BV will be described later in more detail.

The spacer layer 40 is provided between the inner wall of the through hole BV and the metal electrode 100 and electrically isolates the semiconductor substrate 10 and the through electrode TSV from each other. The spacer layer 40 also serves as a mask when the gate dielectric film 32 at the bottom of the through hole BV is removed in formation of the through hole BV.

A boundary portion BD between the STI 20 and the gate dielectric film 32 is located to be farther from the center of the through hole BV than an end (a bottom-surface end) E1 of the through hole BV in the first face F1. That is, the boundary portion BD is located outside the end E1 of the through hole BV. The spacer layer 40 covers the boundary portion BD and is provided up to the top of the gate dielectric film 32. This means that, in plan view as viewed in the Z-direction, the gate dielectric film 32 protrudes (extends) inward in the radial direction of the through hole BV from the inner circumference of the STI 20. The end E1 is an end of the bottom surface of the through hole BV on the first face F1 side.

With this configuration, the STI 20 or the spacer layer 40 is provided between the metal electrode 100 and the semiconductor substrate 10. Between the gate electrode (the electrode pad) 60 of the through electrode TSV and the semiconductor substrate 10, the STI 20 and the gate dielectric film 32 are provided. Accordingly, a breakdown voltage between the through electrode TSV and the semiconductor substrate 10 and a breakdown voltage between the gate electrode (the electrode pad) 60 and the semiconductor substrate 10 are kept high.

For example, in a case where the STI 20 is not provided in the through electrode TSV, only the spacer layer 40 is interposed between the metal electrode 100 and the semiconductor substrate 10, so that a breakdown voltage between the metal electrode 100 and the semiconductor substrate 10 is reduced. Alternatively, in a case where the opening diameter of the through hole BV is small and an end E2 of the through hole BV does not overlap the STI 20 in plan view from above the first face F1, the semiconductor substrate 10 remains between the metal electrode 100 and the STI 20. Also in this case, the breakdown voltage between the semiconductor substrate 10 and the gate electrode (the electrode pad) 60 is reduced. The end E2 is an end of the opening of the through hole BV on the second face F2 side.

Meanwhile, in a case where the gate dielectric film 32 is not provided in a region of the through hole BV surrounded by the STI 20 and the thick STI 20 is provided in the entire region of the through hole BV, the breakdown voltage between the semiconductor substrate 10 and the metal electrode 100 and the breakdown voltage between the semiconductor substrate 10 and the gate electrode 60 become high. However, it is necessary to form the spacer layer 40 as a mask to be thick on the second face F2 as described above, and the opening diameter of the through hole BV in the first face F1 becomes small because of an overhang of the spacer layer 40. In this case, a contact resistance between the metal electrode 100 and the gate electrode 60 is increased.

On the other hand, according to the present embodiment, the STI 20 protrudes in the radial direction from the inner wall of the through hole BV toward the center of the through hole BV in plan view as viewed from above the first face F1. Therefore, the semiconductor substrate 10 is not interposed between the STI 20 and the metal electrode 100, and the breakdown voltage between the through electrode TSV and the semiconductor substrate 10 can be kept relatively high.

Further, in plan view from above the first face F1, the gate dielectric film 32 protrudes in the radial direction from the boundary portion BD between the gate dielectric film 32 and the STI 20 toward the center of the through hole BV. Therefore, it is found that the gate dielectric film 32 is provided in the through hole BV in formation of the through hole BV. As described above, the opening diameter of the through hole BV can be formed to be large because of formation of the gate dielectric film 32 in the region of the through hole BV. Accordingly, the area of contact between the metal electrode 100 and the gate electrode 60 can be made large, so that the contact resistance between them can be reduced. Further, the gate dielectric film 32 is the gate dielectric film 32 of the high voltage transistor HV which is relatively thick among the gate dielectric films 30 to 32. Therefore, the gate dielectric film 32 can serve as an etching stopper for the through hole BV.

Next, the planar shape of the through electrode TSV is described.

Figure 3:
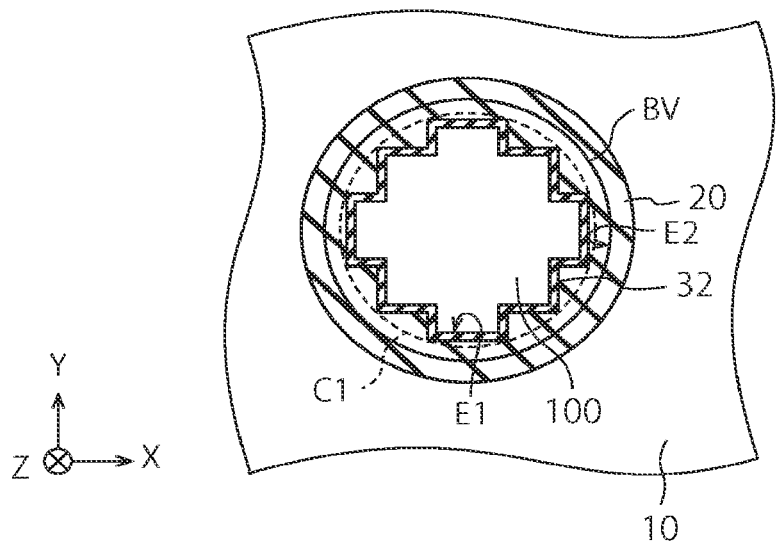
FIG. 3 is a plan views illustrating a configuration example of the through electrode.
Figure 4:
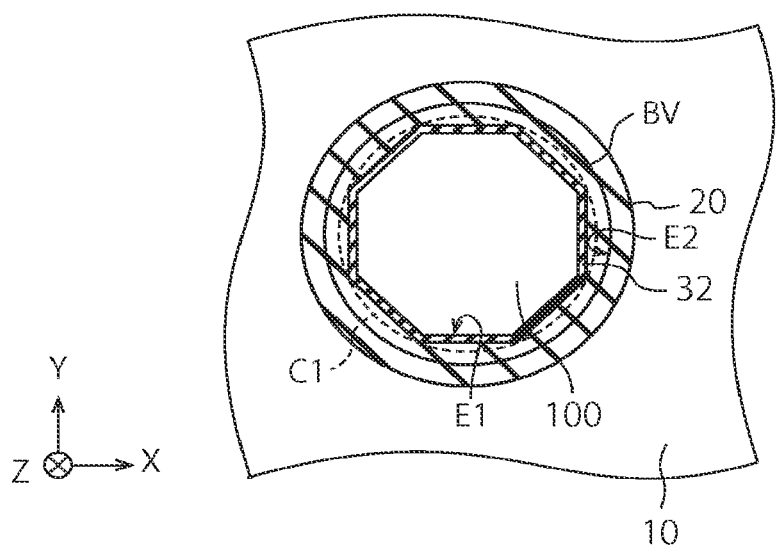
FIG. 4 is a cross-sectional view illustrating a configuration example of the through electrode.

FIGS. 3 and 4 are plan views illustrating configuration examples of the through electrode TSV. FIGS. 3 and 4 illustrate planar layouts of the through hole TSV in the first face F1 along a line 2-2 in FIGS. 1 and 2, respectively.

The end E2 of the through hole BV illustrated in FIGS. 3 and 4 represents an opening end in the second face F2, and the end E1 of the through hole BV represents an opening end in the first face F1. That is, in the through hole BV, the shape of the end E2 in the second face F2 (for example, a substantially circular shape) and the shape of the end E1 in the first face F1 (for example, a substantially polygonal shape) are different from each other. The shape of the end E1 is determined by the shape of the STI 20.

The STI 20 is provided along the end E2 of the through hole BV. The semiconductor substrate 10 is provided outside the STI 20. The STI 20 protrudes (extends) up to the inside of the end E2 of the through hole By. Therefore, it is found that the STI 20 overlaps the end E2 of the through hole BV in plan view as viewed from above the first face F1.

Inside the STI 20, the gate dielectric film 32 protrudes (extends) toward the center of the through hole BV. The gate dielectric film 32 is provided along the inner end of the STI 20 all over the inner end. Inside a region surrounded by the gate dielectric film 32, the metal electrode 100 and the gate electrode 60 are in contact with each other. That is, the area of the region surrounded by the gate dielectric film 32 is the area of contact between the through electrode TSV and the gate electrode 60. The inner end of the gate dielectric film 32 corresponds to the end E1 of the through hole BV in the first face F1.

A broken line in FIGS. 3 and 4 represents a circumscribed circle Cl of the gate dielectric film 32. The circumscribed circle Cl may be enlarged to the through hole BV. However, it is preferable that the circumscribed circle Cl is located inside the end E2 of the through hole BV by about 1 μm, for example, considering misalignment in lithography when the through hole BV is formed. With this setting, the end E2 of the through hole BV does not overlap the gate dielectric film 32 even when misalignment occurs.

If the end E2 of the through hole BV overlaps the gate dielectric film 32, the semiconductor substrate 10 remains between the metal electrode 100 and the STI 20 as described above, so that a breakdown voltage between the metal electrode 100 and the semiconductor substrate 10 is reduced. Therefore, it is possible to prevent reduction of the breakdown voltage between the metal electrode 100 and the semiconductor substrate 10 by ensuring a margin between the circumscribed circle Cl and the end E2.

In FIG. 3, the shape of the contact region between the through electrode TSV and the gate electrode 60 in the first face F1 (the shape of the end E1) is a step-like shape or a convex shape that is inscribed with the circle Cl. In FIG. 4, the shape of the contact region between the through electrode TSV and the gate electrode 60 in the first face F1 (the shape of the end E1) is a polygon that is inscribed with the circle Cl. However, the shape of the contact region between the through electrode TSV and the gate electrode 60 is not limited thereto. For example, the shape of the contact region may be substantially circular, substantially oval, or substantially polygonal.

As illustrated in FIGS. 3 and 4, the end E2 of the opening of the through hole BV overlaps the STI 20 in plan view as viewed in the Z-direction. The end E2 of the through hole BV does not protrude to the outside or inside of the STI 20, and the STI 20 is exposed in the sidewall of the through hole BV inside the STI 20. Since the end E2 of the through hole BV does not protrude to the outside of the STI 20, a material for the barrier metal 99 or the metal electrode 100 does not enter between the semiconductor substrate 10 and the STI 20. Therefore, it is possible to prevent reduction of a breakdown voltage between the metal electrode 100 and the semiconductor substrate 10. Further, since the end E2 of the through hole BV does not protrude to the inside of the STI 20, the semiconductor substrate 10 does not remain between the metal electrode 100 and the STI 20. Therefore, it is possible to prevent reduction of a breakdown voltage between the metal electrode 100 and the semiconductor substrate 10.

Next, a manufacturing method of the semiconductor device 1 is described.

FIGS. 5 to 13 are cross-sectional views illustrating an example of the manufacturing method of the semiconductor device 1. First, the gate dielectric films 30 to 32 are formed on the first face F1 of the semiconductor substrate 10. The gate dielectric film 30 is a gate dielectric film of the very low voltage transistor VLV, the gate dielectric film 31 is a gate dielectric film of the low voltage transistor LV, and the gate dielectric film 32 is a gate dielectric film of the high voltage transistor HV. The gate dielectric films 30 to 32 may be silicon oxide films formed by thermal oxidation of the semiconductor substrate 10, for example.

Next, the STIs 20 are formed in element isolation regions on the first face F1. An active area is defined between the STIs 20 by formation of the STIs 20. The well diffusion layer 15 is formed in each active area. The STI 20 is provided to surround the outer circumference of a formation region of the through electrode TSV but is not provided in a center portion of that formation region. That is, the STI 20 is formed in an annular shape in plan view. The STI 20 surrounds the gate dielectric film 32. The annular shape includes not only a circular ring shape but also a polygonal ring shape, for example. A lower end portion of the STI 20 may be formed to be closer to the second face F2 than a lower end portion of the gate dielectric film 32.

Therefore, in the through electrode TSV, the gate dielectric film 32 is formed in the center portion of the through electrode TSV surrounded by the STI 20. The gate dielectric film 32 is thinner than the STI 20. For example, the thickness of the gate dielectric film 32 is about 20 to 60 nm, while the thickness of the STI 20 is about 300 to 500 nm. The gate dielectric film 32 formed in the formation region of the through electrode TSV is thicker than the gate dielectric films 30 and 31 and therefore serves as an etching stopper in formation of the through hole BV. Also, since the gate dielectric film 32 is thinner than the STI 20, the gate dielectric film 32 can be easily removed when an opening at the bottom of the through hole BV is formed. In this manner, on the first face F1, the gate dielectric film 32 is formed not only in a formation region of the high voltage transistor HV in the active area but also in the formation region of the through hole BV in this manner.

Next, a material for the gate electrode 60 (for example, doped polysilicon) is deposited on the gate dielectric films 30 to 32. A metal material (for example, tungsten) is deposited on the gate electrode 60, thereby turning an upper portion of the gate electrode 60 into silicide. Accordingly, the metal film 65 (for example, tungsten silicide) is formed on the gate electrode 60. A material for the cap film 70 (for example, silicon nitride) is deposited on the metal film 65.

Next, the material for the cap film 70 is processed into patterns of gate electrodes of the very low voltage transistor VLV, the low voltage transistor LV, and the high voltage transistor HV by lithography and RIE (Reactive Ion Etching), for example. Further, the materials for the metal film 65 and the gate electrode 60 are processed into the patterns of the gate electrodes of the very low voltage transistor VLV, the low voltage transistor LV, and the high voltage transistor HV by using the cap film 70 as a mask. Accordingly, the gate electrode 60, the metal film 65, and the cap film 70 are formed.

At this time, the gate electrode 60, the metal film 65, and the cap film 70 may also be formed in a formation region of the through electrode TSV simultaneously. That is, the gate electrode 60, the metal film 65, and the cap film 70 are formed in the entire region surrounded by the STI 20 of the through hole BV to be in contact with the STI 20. The gate electrode 60 and the metal film 65 in the through electrode TSV serve as an electrode pad. The gate dielectric film 32 of the high voltage transistor HV and the gate dielectric film 32 in the formation region of the through electrode TSV may be formed at the same level as each other as viewed from the semiconductor substrate. The gate electrode 60 of the high voltage transistor HV and the gate electrode 60 in the formation region of the through electrode TSV may be formed at the same level as each other as viewed from the semiconductor substrate.

Figure 5:
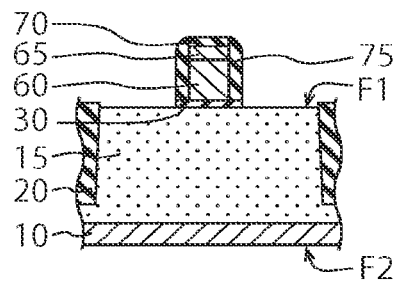
FIG. 5 is a cross-sectional view illustrating an example of a manufacturing method of a semiconductor device.
Figure 5:
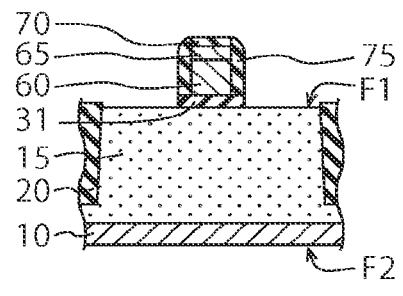
Figure 5:
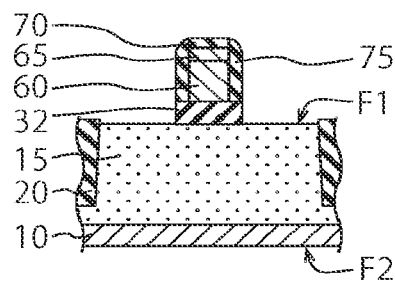
Figure 5:
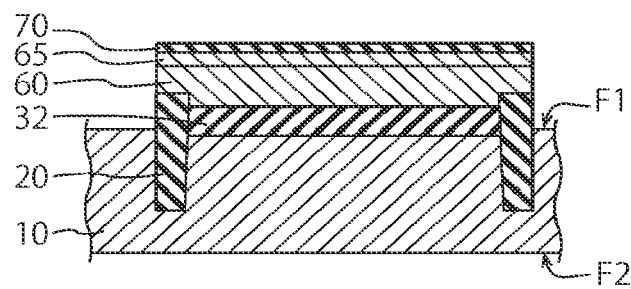
Figure 5:
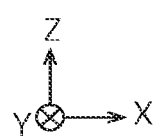

Next, the sidewall film 75 is formed on sidewalls of the gate electrode 60, the metal film 65, and the cap film 70. The gate dielectric films 30 to 32 are etched by using the cap film 70 and the sidewall film 75 as a mask. Accordingly, the structure illustrated in FIG. 5 is obtained.

Next, an outer portion of the sidewall film 75 is covered by the liner layer 76. For example, a silicon nitride film is used as the liner layer 76. Next, the interlayer dielectric film 80 is deposited, and is polished by CMP (Chemical Mechanical Polishing) or the like until the cap film 70 is exposed. Subsequently, the stopper film 77 is formed on the cap film 70 and the interlayer dielectric film 80, and the interlayer dielectric film 80 is further deposited on the stopper film 77.

Figure 6:
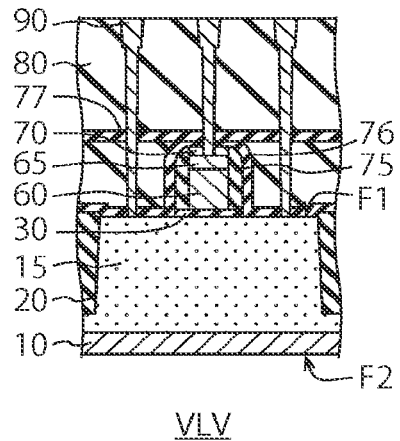
FIG. 6 is a cross-sectional view illustrating the manufacturing method of the semiconductor device following FIG. 5.
Figure 6:
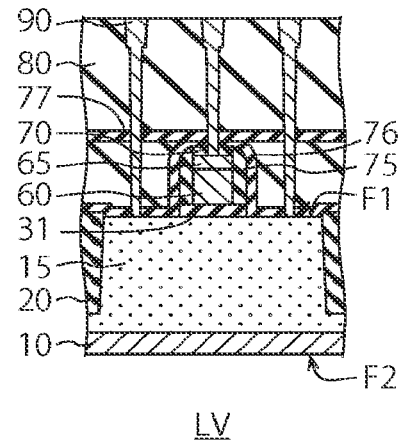
Figure 6:
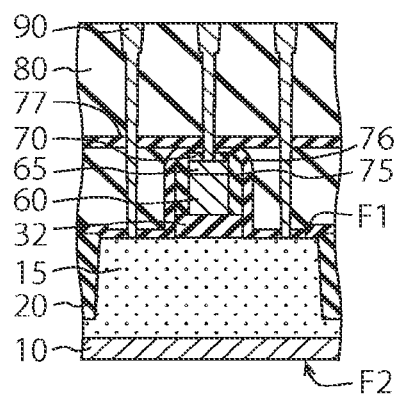
Figure 6:
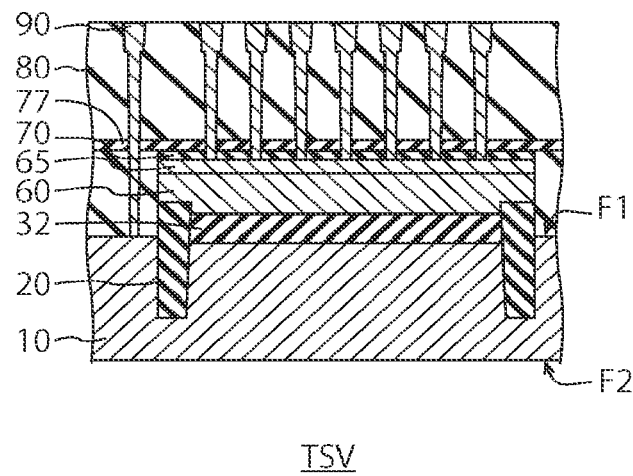

Next, contact holes are formed in the interlayer dielectric film 80 by lithography and etching. At this time, the stopper film 77 and the cap film 70 serve as an etching stopper. Accordingly, some contact holes are formed to reach the metal film 65 on the gate electrode 60 and other contact holes are formed to reach the first face F1 of the semiconductor substrate 10. Subsequently, a metal material (for example, tungsten or copper) is embedded into the contact holes, so that the via plugs 90 are formed. Accordingly, the structure illustrated in FIG. 6 is obtained.

Figure 7:
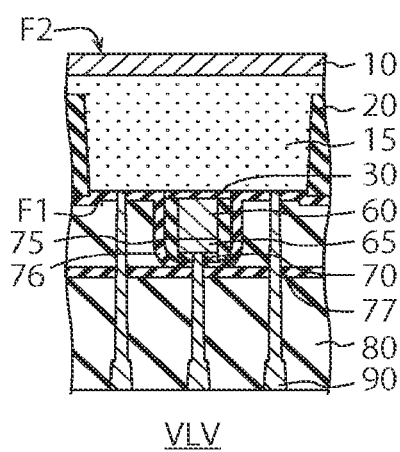
FIG. 7 is a cross-sectional view illustrating the manufacturing method of the semiconductor device following FIG. 6.
Figure 7:
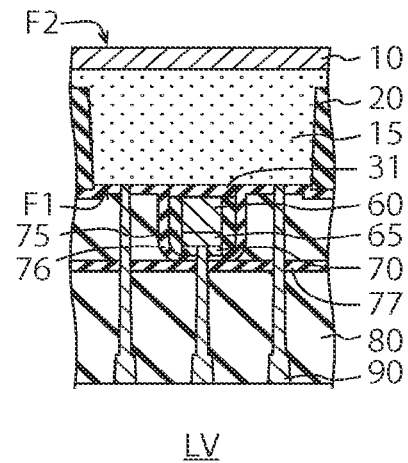
Figure 7:
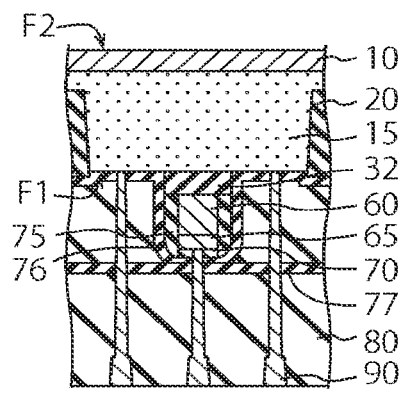
Figure 7:
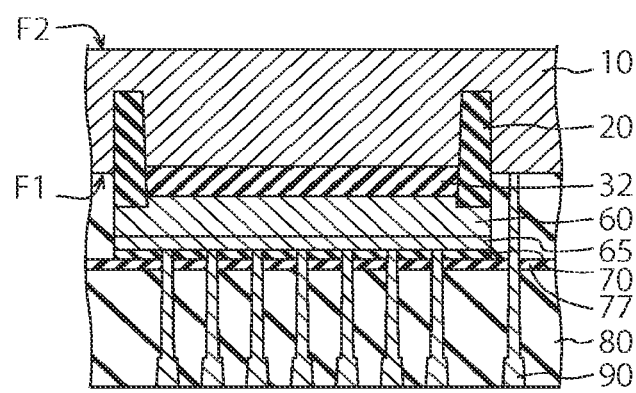
Figure 7:
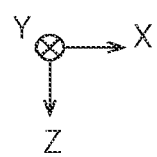
Figure 8:
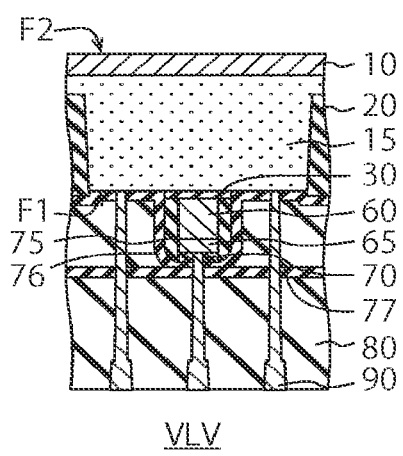
FIG. 8 is a cross-sectional view illustrating the manufacturing method of the semiconductor device following FIG. 7.
Figure 8:
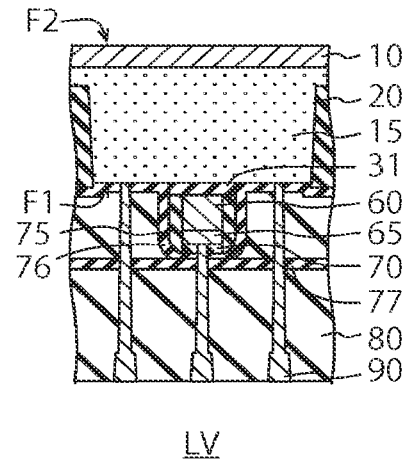
Figure 8:
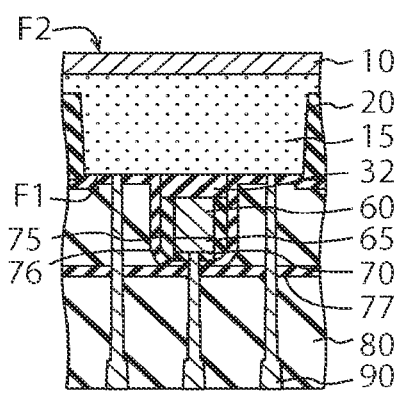
Figure 8:
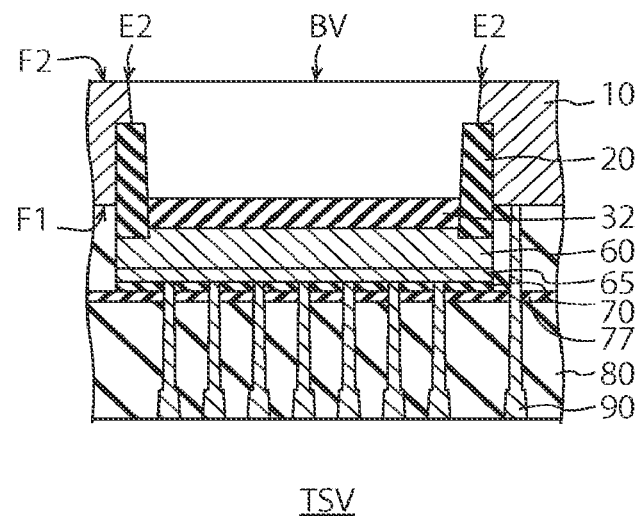
Figure 8:
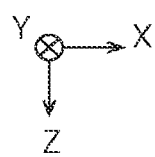

Next, the semiconductor substrate 10 is turned upside down as illustrated in FIG. 7. Subsequently, the through hole BV is formed in a formation region of the through electrode TSV by lithography and etching, as illustrated in FIG. 8. The through hole BV is formed to penetrate through the semiconductor substrate 10 from the second face F2 to the gate dielectric film 32 in the formation region of the through hole BV. The through hole BV is formed on the gate dielectric film 32 in its formation region and on the STI 20 around that gate dielectric film 32. Therefore, the end E2 of the through hole BV is formed to overlap the STI 20 around the gate dielectric film 32 in plan view as viewed in the Z-direction. Accordingly, at least a portion of the STI 20 appears in a portion of the inner wall of the through hole BV, and the inner wall of the through hole BV is configured by the semiconductor substrate 10 and the STI 20. In the above-described plan view, the STI 20 protrudes in the radial direction from the inner wall of the through hole BV toward the center of the through hole BV. The STI 20 protrudes all over the inner circumference of the through hole BV. At this time, the semiconductor substrate (for example, silicon) 10 is selectively removed, and the gate dielectric film 32 serves as an etching stopper.

Figure 9:
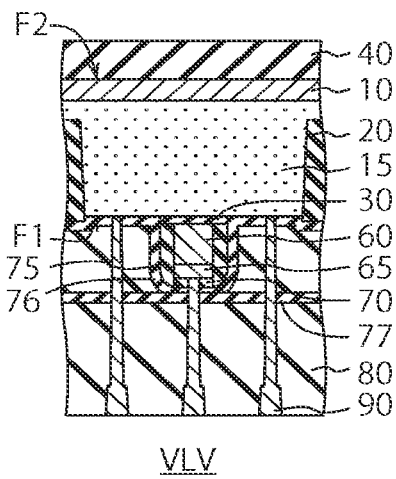
FIG. 9 is a cross-sectional view illustrating the manufacturing method of the semiconductor device following FIG. 8.
Figure 9:
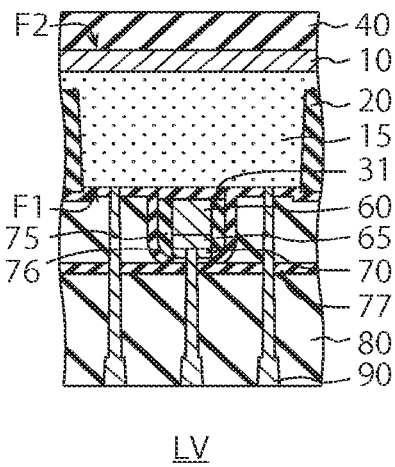
Figure 9:
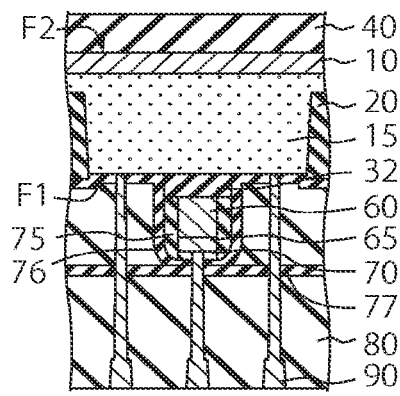
Figure 9:
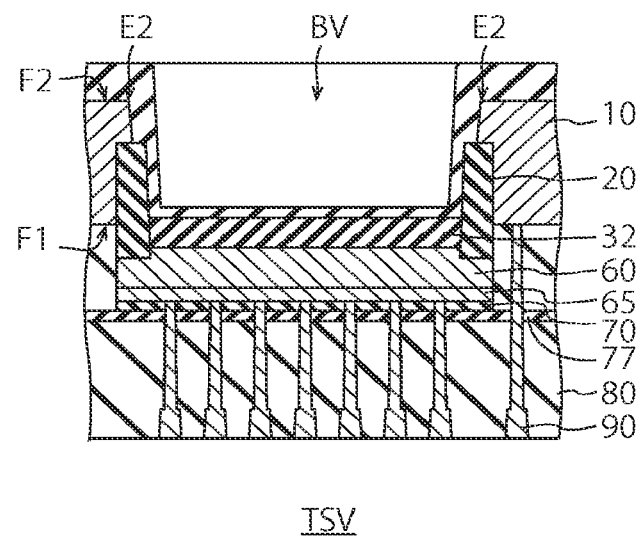
Figure 9:
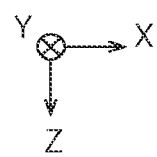

Next, as illustrated in FIG. 9, the spacer layer 40 is deposited on the inner side surface and the bottom surface of the through hole BV and on the second face F2 of the semiconductor substrate 10. For example, a silicon oxide film (for example, a TEOS film), a silicon hydride oxide film, a silicon nitride film, or a silicon oxynitride film, or a multilayer film of two or more of them is used as the spacer layer 40. The spacer layer 40 covers the entire inner wall of the through hole BV, and covers the semiconductor substrate 10 and the STI 20 in the inner wall of the through hole BV. Further, the spacer layer 40 covers both the gate dielectric film 32 and the STI 20 at an end of the bottom surface of the through hole BV, and is in contact with both of them.

Figure 10:
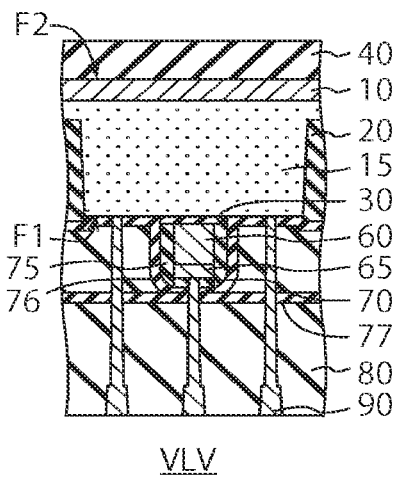
FIG. 10 is a cross-sectional view illustrating the manufacturing method of the semiconductor device following FIG. 9.
Figure 10:
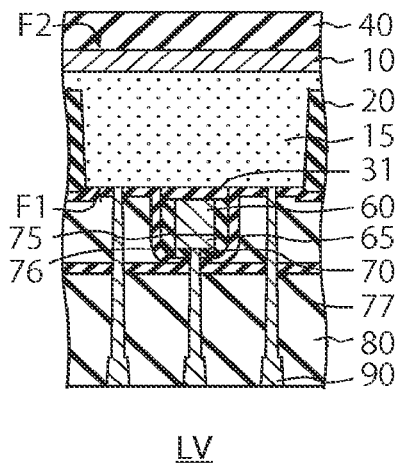
Figure 10:
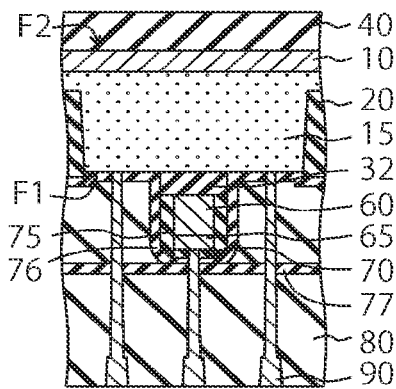
Figure 10:
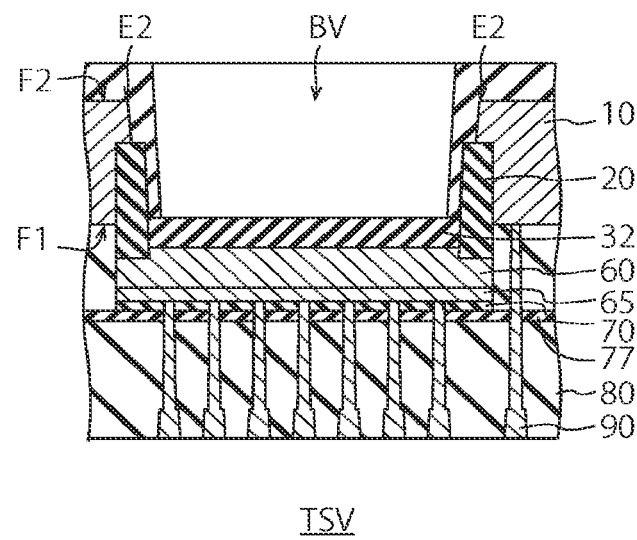

By controlling coverage in CVD, the spacer layer 40 is deposited to be relatively thick on the second face F2 of the semiconductor substrate 10 in the outside of the through hole BV. Meanwhile, the spacer layer 40 is deposited to be relatively thin on the bottom surface of the through hole BV. Therefore, by etching back the spacer layer 40 by RIE, it is possible to remove the spacer layer 40 located on the bottom surface of the through hole BV in a self-aligning manner without using lithography. That is, by using the microloading effect of RIE, the spacer layer 40 located on the bottom surface of the through hole BV is removed, while the spacer layer 40 located on the second face F2 of the semiconductor substrate 10 and on the inner side surface of the through hole BV is left. Accordingly, the structure illustrated in FIG. 10 is obtained.

Figure 11:
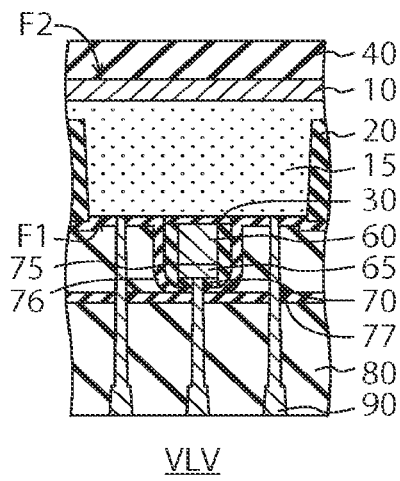
FIG. 11 is a cross-sectional view illustrating the manufacturing method of the semiconductor device following FIG. 10.
Figure 11:
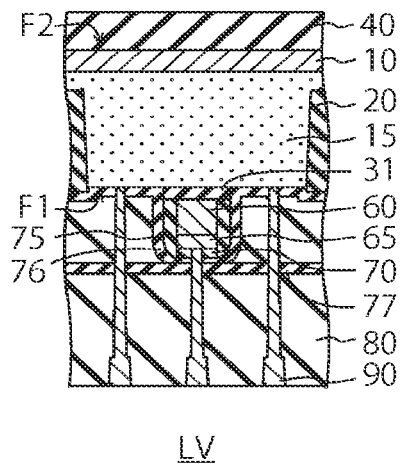
Figure 11:
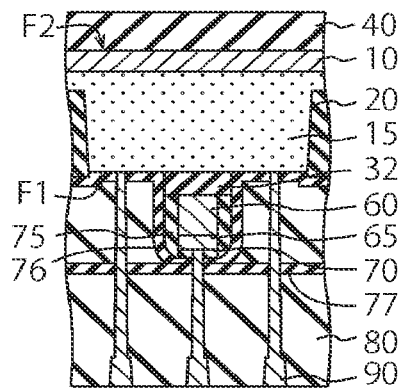
Figure 11:
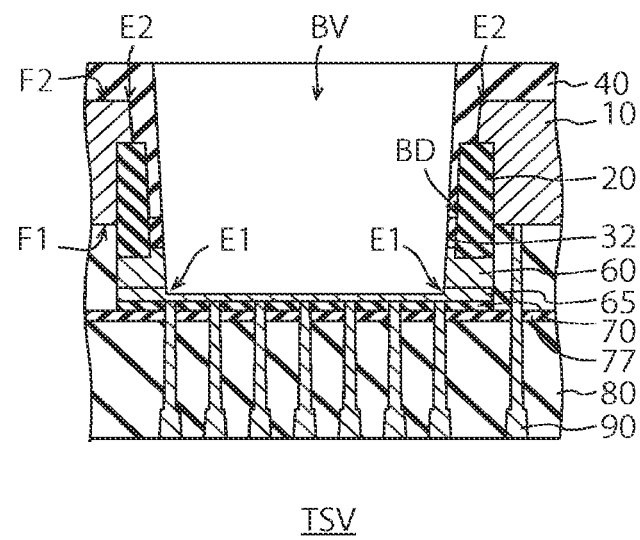

Further, the gate dielectric film 32 and the gate electrode 60 located on the bottom surface of the through hole BV are removed by using the spacer layer 40 located on the second face F2 of the semiconductor substrate 10 and on the inner side surface of the through hole BV as a mask. Accordingly, the structure illustrated in FIG. 11 is obtained. Alternatively, it suffices that the gate dielectric film 32 is removed, even if the gate electrode 60 is not removed. At this time, since the gate dielectric film 32 is thinner than the STI 20, the gate dielectric film 32 can be easily removed at the bottom of the through hole BV even when the spacer layer 40 is relatively thin. Therefore, it is unnecessary to form the spacer layer 40 to be thick, and it is possible to prevent an overhang of the spacer layer 40 at the end E2 of the opening of the through hole By. By preventing an overhang of the spacer layer 40, the opening at the end E2 of the through hole BV is kept large. As a result, it is possible to make the opening diameter at the bottom of the through hole BV (the opening diameter at the end E1) large, so that a contact resistance between the through electrode TSV and the gate electrode (the electrode pad) 60 can be reduced.

In plan view as viewed in the Z-direction, the boundary portion BD between the STI 20 and the gate dielectric film 32 is located inside the end E2 of the through hole BV and outside the end E1. That is, the STI 20 protrudes from the inner wall of the through hole BV toward the center of the through hole BV. Therefore, the STI 20 protrudes toward the center of the through hole BV with respect to the end E2. The gate dielectric film 32 protrudes toward the center of the through hole BV from the STI 20. Therefore, the gate dielectric film 32 protrudes toward the center of the through hole BV with respect to the boundary portion BD. The end E1 inside the gate dielectric film 32 becomes an outer edge of a contact region between the through electrode TSV and the gate electrode (the electrode pad) 60. With this configuration, it is found that the STI 20 is provided to surround a formation region of the through hole BV and the gate dielectric film 32 is provided within the formation region of the through hole BV surrounded by the STI 20.

Figure 12:
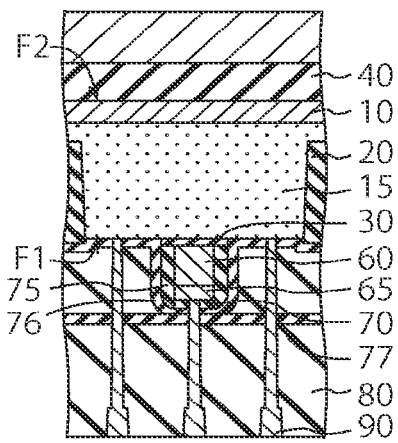
FIG. 12 is a cross-sectional view illustrating the manufacturing method of the semiconductor device following FIG. 11.
Figure 12:
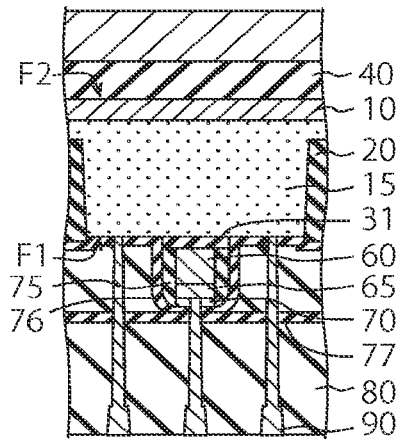
Figure 12:
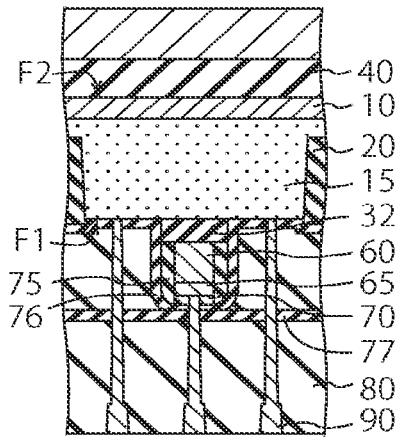
Figure 12:
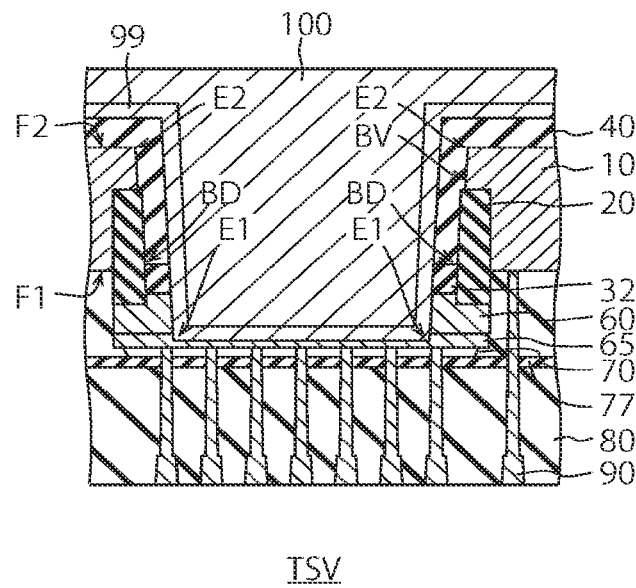
Figure 12:
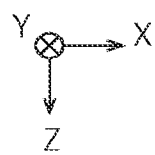

Next, as illustrated in FIG. 12, a material for the barrier metal 99 (for example, Ti or TiN) is formed on the inner wall of the through hole BV. Further, a material for the metal electrode 100 (for example, copper or tungsten) is filled into the through hole BV on the barrier metal 99.

Figure 13:
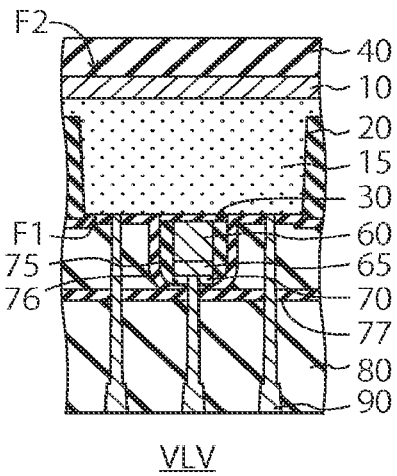
FIG. 13 is a cross-sectional view illustrating the manufacturing method of the semiconductor device following FIG. 12.
Figure 13:
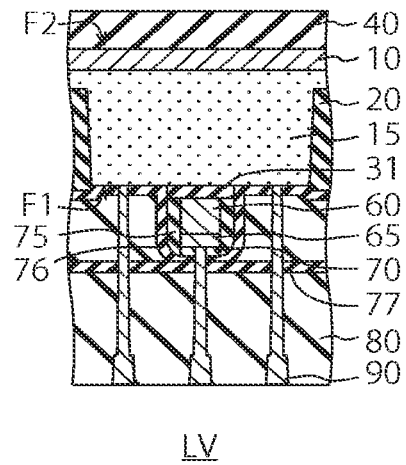
Figure 13:
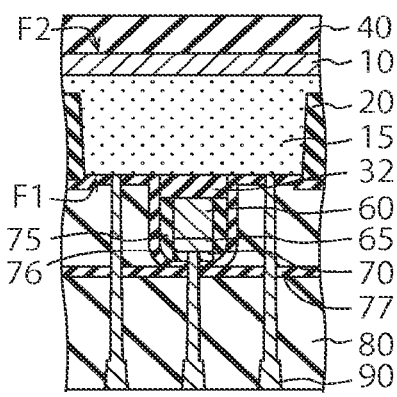
Figure 13:
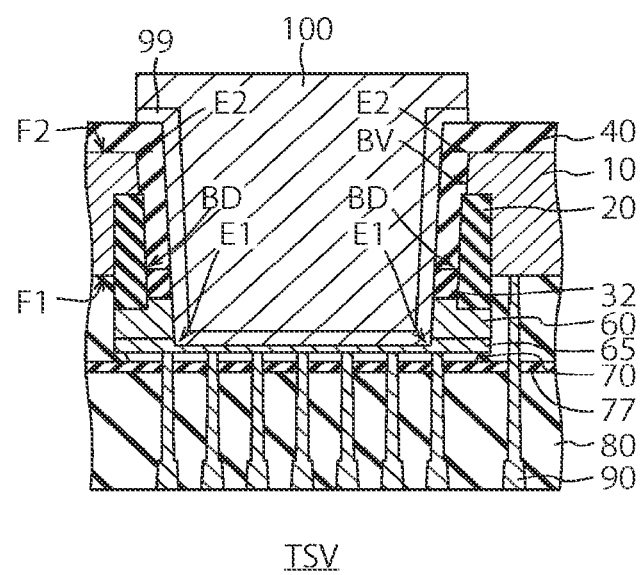
Figure 13:
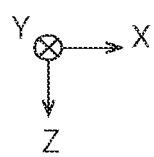

Subsequently, the materials for the metal electrode 100 and the barrier metal 99 on the second face F2 of the semiconductor substrate 10 are removed by lithography and etching. Accordingly, the structure illustrated in FIG. 13 is obtained.

Thereafter, the bump 110 is formed on the metal electrode 100, so that the semiconductor device 1 illustrated in FIGS. 1 and 2 is completed.

According to the present embodiment, the STI 20 is provided on the outer circumference of a formation region of the through electrode TSV, and the gate dielectric film 32 is provided in a center portion of that formation region. The gate dielectric film 32 is the gate dielectric film 32 of the high voltage transistor HV, and is thicker than the gate dielectric films 30 and 31 of the other transistors VLV and LV but is thinner than the STI 20. Therefore, the gate dielectric film 32 can serve as an etching stopper for the through hole BV, and enables the opening diameter of the through hole BV to be made larger by reducing the thickness of the spacer layer 40. Accordingly, it is possible to reduce a contact resistance between the through electrode TSV and the gate electrode (the electrode pad) 60.

Further, by providing the gate dielectric film 32 that is thinner than the STI 20 on the bottom surface of the through hole BV, it is possible to easily remove the gate dielectric film 32 at the bottom of the through hole BV even when the difference of the thickness of the spacer layer 40 between at the bottom of the through hole BV and on the second face F2 is small. Therefore, even when an aspect ratio of the through hole BV is small and the difference of the thickness of the spacer layer 40 is small, it is possible to surely expose the gate electrode 60 at the bottom of the through hole BV. As a result, it is possible to connect the through electrode TSV to a gate electrode (a metal pad) with low resistance while reducing the thickness of a package of the semiconductor device 1, so that a resistance between semiconductor chips can be reduced.

Furthermore, the end E2 of the opening of the through hole BV overlaps the STI 20 in plan view as viewed in the Z-direction, and the STI 20 is exposed in a sidewall of the through hole BV. This arrangement prevents a material for the barrier metal 99 or the metal electrode 100 from entering between the through hole BV and the STI 20, and also prevents the semiconductor substrate 10 from remaining between the metal electrode 100 and the STI 20. As a result, it is possible to prevent reduction of a breakdown voltage between the through electrode TSV and the semiconductor substrate 10.

In addition, the STI 20 protrudes (extends) from the sidewall of the through hole BV toward the center of the through hole BV. Accordingly, it is possible to keep a distance between the gate electrode 60 and the semiconductor substrate 10, so that a breakdown voltage between the gate electrode 60 and the semiconductor substrate 10 can be kept high.

(Modification)

Figure 14:
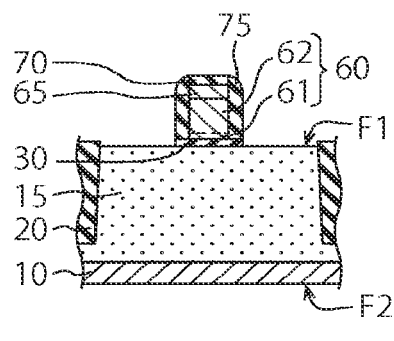
FIG. 14 is a cross-sectional view illustrating one of processes of manufacturing a semiconductor according to a modification of the present embodiment.
Figure 14:
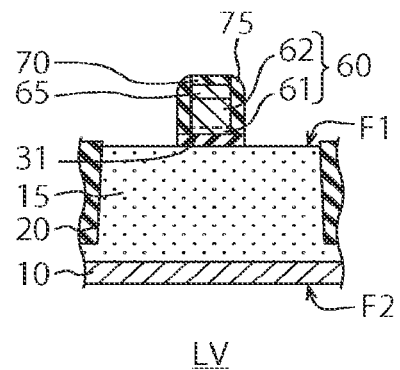
Figure 14:
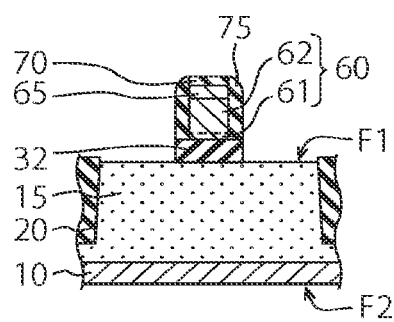
Figure 14:
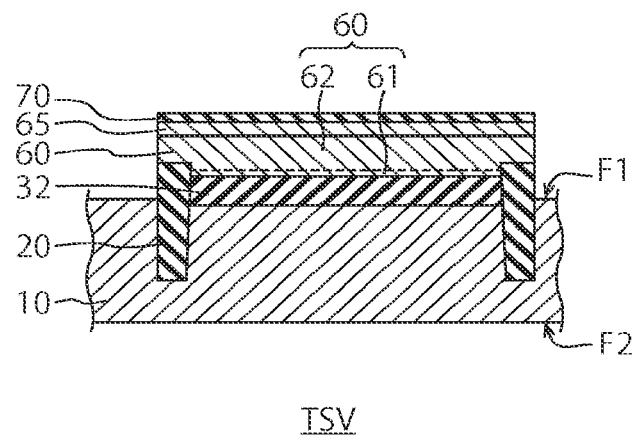

FIG. 14 is a cross-sectional view illustrating one of processes of manufacturing the semiconductor device 1 according to a modification of the present embodiment. The process in FIG. 14 corresponds to the process in FIG. 5. In the present modification, the gate electrode 60 may be a stack of a first electrode layer 61 and a second electrode layer 62. In this case, the first electrode layer 61 may be formed prior to formation of the STI 20. That is, after the gate dielectric film 32 is formed, the first electrode layer 61 is formed. Thereafter, the STI 20 is formed. Subsequently, the second electrode layer 62 is stacked, and thereafter the metal film 65 is stacked. Accordingly, a portion of the gate electrode 60 is formed prior to formation of the STI 20. The gate electrode 60 of each of the very low voltage transistor VLV, the low voltage transistor LV, and the high voltage transistor HV may also be formed similarly. The first electrode layer 61 and the second electrode layer 62 may be formed of the same material as each other or may be formed of different materials from each other.

As illustrated in FIG. 14, a top surface of the first electrode layer 61 may be closer to the first face F1 than a top surface of the STI 20. At this time, the first electrode layer 61 is not formed on the STI 20.

Similarly, the gate electrode 60 of each of the very low voltage transistor VLV, the low voltage transistor LV, and the high voltage transistor HV may also include the first electrode layer 61 and the second electrode layer 62. At this time, the gate dielectric film 32 of the high voltage transistor HV may be formed simultaneously with the gate dielectric film 32 in a TSV formation region. The gate electrode 60 of the high voltage transistor HV may be formed simultaneously with the gate electrode 60 in the TSV formation region.

The STI 20, the gate dielectric film 32, and the spacer layer 40 may each include a silicon oxide film, and the film density of the silicon oxide film may be different between the STI 20, the gate dielectric film 32, and the spacer layer 40. The film density of the silicon oxide film in the gate dielectric film 32 may be higher than that in the STI 20. The film density of the silicon oxide film in the STI 20 may be higher than that in the spacer layer 40.

Other configurations and manufacturing processes of the present modification may be identical to those of the embodiments described above.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
   a semiconductor substrate having a first face provided with a semiconductor element and a second face opposite to the first face;
   a metal electrode provided in a through hole that penetrates through the semiconductor substrate between the first face and the second face;
   a first insulating film provided on a first part of an inner wall of the through hole, and partially protruding from the semiconductor substrate in a first direction which is a direction from the second surface toward the first surface;
   a second insulating film protruding in a radial direction from the first insulating film as viewed from above the first face, being thinner than the first insulating film, and being in contact with the metal electrode; and
   a third insulating film provided between the inner wall of the through hole and the metal electrode and including a first portion that is in contact with the first insulating film and a second portion that is in contact with a second part different from the first part of the inner wall of the through hole.

2. The device of claim 1, further comprising an electrode pad provided on a side close to the first face and electrically connected to the metal electrode, wherein
   the first insulating film is provided between the electrode pad and the semiconductor substrate.

3. The device of claim 1, wherein
   the first insulating film, the second insulating film, and the third insulating film contain silicon oxide, and the first insulating film, the second insulating film, and the third insulating film are different from one another in film density of the silicon oxide.

4. The device of claim 1, wherein the semiconductor element includes a first transistor having a first gate dielectric film, a second transistor having a second gate dielectric film thinner than the first gate dielectric film, and a third transistor having a third gate dielectric film thinner than the second gate dielectric film.

5. The device of claim 4, wherein the second insulating film is thicker than the second gate dielectric film.

6. A semiconductor device comprising:
a semiconductor substrate having a first face provided with a semiconductor element and a second face opposite to the first face;
a metal electrode provided in a through hole that penetrates through the semiconductor substrate between the first face and the second face;
an insulating film provided between the metal electrode and an inner wall of the through hole; and
an electrode pad connected to the metal electrode on a side close to the first face, wherein
the electrode pad has a first electrode surface and a second electrode surface, the first electrode surface facing the first face of the semiconductor substrate and being formed in a peripheral portion of the electrode pad, the second electrode surface being located inside the first electrode surface in a radial direction of the through hole, being closer to the first face or the second face of the semiconductor substrate than the first electrode surface, and facing in a same direction as the first electrode surface.

7. The device of claim 6, wherein the insulating film includes a first insulating film that is in direct contact with the first electrode surface, a second insulating film that is in direct contact with the second electrode surface and is thinner than the first insulating film, and a third insulating film including a first portion that is in direct contact with the first insulating film and a second portion that is in a direct contact with a side surface of the through hole and is closer to the second face of the semiconductor substrate than the first portion.

8. The device of claim 7, wherein the semiconductor element includes a first transistor having a first gate dielectric film, a second transistor having a second gate dielectric film thinner than the first gate dielectric film, and a third transistor having a third gate dielectric film thinner than the second gate dielectric film.

9. The device of claim 8, wherein the second insulating film is thicker than the second gate dielectric film.

10. The device of claim 6, wherein
the insulating film includes a first insulating film, a second insulating film, and a third insulating film contain silicon oxide, and
the first insulating film, the second insulating film, and the third insulating film are different from one another in film density of the silicon oxide.

* * * * *